United States Patent
Park et al.

(10) Patent No.: US 7,859,042 B2
(45) Date of Patent: Dec. 28, 2010

(54) NONVOLATILE MEMORY DEVICES

(75) Inventors: Bong-Tae Park, Seoul (KR);
Jeong-Hyuk Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 677 days.

(21) Appl. No.: 11/499,268

(22) Filed: Aug. 4, 2006

(65) Prior Publication Data
US 2007/0032017 A1    Feb. 8, 2007

(30) Foreign Application Priority Data
Aug. 4, 2005    (KR) ................ 10-2005-0071477

(51) Int. Cl.
*H01L 29/66* (2006.01)
*H01L 29/788* (2006.01)
*H01L 29/792* (2006.01)

(52) U.S. Cl. .............. 257/315; 257/326; 257/332; 257/E27.103; 257/E29.129; 257/E29.3

(58) Field of Classification Search .............. 257/315, 257/326, 332, E27.103, E29.3
See application file for complete search history.

(56) References Cited

U.S. PATENT DOCUMENTS

| | | | | |
|---|---|---|---|---|
| 5,680,345 A * | 10/1997 | Hsu et al. | ............... | 365/185.01 |
| 6,413,818 B1 * | 7/2002 | Huang et al. | ................ | 438/257 |
| 6,498,064 B2 * | 12/2002 | Tseng | ..................... | 438/257 |
| 6,818,511 B2 * | 11/2004 | Lee | ............. | 438/266 |
| 6,838,342 B1 * | 1/2005 | Ding | ..................... | 438/257 |
| 6,841,444 B2 * | 1/2005 | Shimizu | .................. | 438/257 |
| 6,906,377 B2 * | 6/2005 | Ni et al. | ..................... | 257/315 |
| 7,303,958 B2 * | 12/2007 | Jeong | ..................... | 438/257 |
| 2002/0195646 A1 * | 12/2002 | Tseng | .................. | 257/315 |
| 2004/0087089 A1 * | 5/2004 | Matsui et al. | ............... | 438/266 |
| 2005/0142765 A1 | 6/2005 | Joo | | |

FOREIGN PATENT DOCUMENTS

| | | |
|---|---|---|
| JP | 2002-246845 | 8/2002 |
| KR | 1020030092997 | 12/2003 |
| KR | 1020040005230 | 1/2004 |

* cited by examiner

*Primary Examiner*—Walter L Lindsay, Jr.
*Assistant Examiner*—Ron Pompey
(74) *Attorney, Agent, or Firm*—Myers Bigel Sibley & Sajovec

(57) ABSTRACT

Methods of fabricating a nonvolatile memory device include forming a trench mask pattern on a semiconductor substrate including a first region and a second region. Substrate trenches defining active regions are formed in the semiconductor substrate in the first region and the second region using the trench mask pattern as a mask. Device isolation layer patterns are formed on the semiconductor substrate including the trench mask pattern and substrate trenches. The device isolation patterns fill the substrate trenches in the first region and in the second region. First and second openings are formed exposing top surfaces of the corresponding active regions in the first and second regions by removing the trench mask pattern. The second opening has a greater width than the first opening. A first lower conductive pattern is formed in the first opening and has a bottom portion in a lower region of the first opening and an extended portion extending from the bottom portion to an upper region of the first opening. The extended portion has a smaller width than the bottom portion. A second lower conductive pattern is formed filling the second opening.

20 Claims, 19 Drawing Sheets

NONVOLATILE MEMORY DEVICES

CROSS-REFERENCE TO RELATED APPLICATION

This application is related to and claims priority under 35 U.S.C. §119 from Korean Patent Application No. 10-2005-0071477, filed on Aug. 4, 2005, in the Korean Intellectual Property Office, the disclosure of which is incorporated herein by reference in its entirety.

BACKGROUND OF THE INVENTION

The present invention relates to semiconductor devices and methods of fabricating the same, and more particularly, to nonvolatile memory devices and methods of fabricating the same.

Semiconductor memory devices may be classified into volatile memory devices and nonvolatile memory devices, depending on whether they need a power supply applied to retain data. Volatile memory devices, such as dynamic random access memories (DRAMs) and static random access memories (SRAMs) typically have a high operating speed but need a power supply applied to retain data. On the other hand, nonvolatile memory devices, such as flash memory devices, can typically retain data even when their power supply is interrupted. Therefore, the nonvolatile memory devices are generally widely used in portable electronic devices, the demand for which is rapidly on the rise.

A decrease in the price of a semiconductor device generally requires an increase in the integration degree thereof. However, such an increase in the integration density of memory devices may lead to various technical problems in a manufacturing process thereof. In particular, the increase in the integration density generally results in a decrease in the distance between adjacent wordlines, which may make it difficult to improve the structure and characteristics of a nonvolatile memory device. For example, a nonvolatile memory device with control and floating gate electrodes generally must have a sufficiently large coupling ratio for a rapid and effective operation, but a decrease in the distance between wordlines may make it difficult to obtain the desired coupling ratio.

More specifically, the coupling ratio may be understood as a transfer efficiency of a voltage from the control gate electrode to the floating gate electrode, which may be determined based on a distance between the control and floating gate electrodes, a dielectric constant of an insulating layer interposed therebetween, and a facing area therebetween. An increase in the coupling ratio typically requires a decrease in the distance between the electrodes and/or an increase in the dielectric constant of the insulating layer. Some attempts based on such a requirement are, however, being confronted by technical limitations accompanied by high integration density. Generally, using the presently available technology, the best method for increasing the coupling ratio may be to increase a facing area between the electrodes. However, in the prior art, the increase in the facing area generally leads to other problems, such as an increase in an electrical interference between the adjacent wordlines.

FIG. 1 is a cross sectional view illustrating a process of fabricating a cell array of a conventional flash memory. Referring to FIG. 1, device isolation layer patterns 20 defining active regions 12 are disposed in predetermined regions of a semiconductor (integrated circuit) substrate 10. A floating gate electrode 30 is disposed on the active region 12, and a gate insulating layer 25 is interposed between the floating gate electrode 30 and the active region 12. A control gate electrode 50 is disposed on the floating gate electrodes 30 that intersects the active regions 12 and the device isolation layer patterns 20. The control gate electrode 50 is used as a wordline for selecting one of memory cells of a cell array. A gate interlayer insulating layer 40 is interposed between the control gate electrode 50 and the floating gate electrode 30.

In the conventional art, the gate interlayer insulating layer 40 generally contacts the top and side surfaces of the floating gate electrode 30, as illustrated in FIG. 1, and the coupling ratio is typically proportional to the contact area therebetween. As the width l of the floating gate electrode 30 and the distance d between the floating gate electrodes 30 generally must be reduced for high integration, an increase in the facing area (i.e., an increase in the coupling ratio) is generally possible only by an increase in the height h of the floating gate electrode 30. The increase in the height of the floating gate electrode 30 involves an increase in a facing area with an adjacent wordline, which may cause the electrical interference as described above. The increase in electrical interference may cause data stored in a given cell to vary.

Various methods for modifying the sectional shape of the floating gate electrode have been proposed to reduce the above electrical interference. One of the methods is to form the floating gate electrode so that it has a "U" shaped section. This method, however, may cause some technical problems in a peripheral circuit region in which wide active regions are formed.

More specifically, in the case of a cell array region with narrow active regions, the sidewalls of device isolation layer patterns surrounding the active region are generally formed perpendicular to a semiconductor substrate. On the contrary, in the case of a peripheral circuit region with a wide active region, the sidewalls of a device isolation layer pattern may have a negative slope (i.e., θ<90°) as illustrated in FIG. 2. This negative slope may cause the device isolation layer pattern to act as an undesirable etch mask in the patterning process used in forming the floating gate electrode.

In particular, according to the conventional method in which the floating gate electrode is formed to have a "U" shaped section as illustrated in FIG. 2, a floating gate conductive layer 30' is generally formed to conformally cover the exposed surface of a device isolation layer pattern 20 and the top surface of a gate insulating layer 25, and a gate interlayer insulating layer 40 is conformally formed on the floating gate conductive layer 30'. However, as the device isolation layer pattern 20 with a negative slope may act as an etch mask, a residue of the gate interlayer insulating layer 40 may be formed (remain) around the sidewalls of the device isolation layer pattern 20 during a subsequent process of removing the gate interlayer insulating layer 40 from a peripheral circuit region. This residue of the gate interlayer insulating layer 40 may act as an etch mask causing a residue of the floating gate conductive layer 30' during the subsequent patterning process. This residue of the floating gate conductive layer 30' may cause an electrical defect, such as a bridge. In the prior art, to address such a problem, an over-etching process may be performed to more completely remove the gate interlayer insulating layer 40 from the peripheral circuit region.

However, as the above over-etching process typically recesses the top surface of the device isolation layer pattern 20, a gate electrode formed in a subsequent process approaches the top surface of the semiconductor substrate 10. This may lead to the formation of parasitic transistors that may cause a hump phenomenon. When considering the fact that transistors with good electrical characteristics, such as sensing circuits, are typically disposed in the peripheral circuit region, the problem due to the parasitic transistors may be fatal to the yield of flash memory devices.

SUMMARY OF THE INVENTION

Embodiments of the present invention include methods of fabricating a nonvolatile memory device. A trench mask pattern is formed on a semiconductor substrate including a first region and a second region. Substrate trenches defining active regions are formed in the semiconductor substrate in the first region and the second region using the trench mask pattern as a mask. Device isolation layer patterns are formed on the semiconductor substrate including the trench mask pattern and substrate trenches. The device isolation patterns fill the substrate trenches in the first region and in the second region. First and second openings are formed exposing top surfaces of the corresponding active regions in the first and second regions by removing the trench mask pattern. The second opening has a greater width than the first opening. A first lower conductive pattern is formed in the first opening and has a bottom portion in a lower region of the first opening and an extended portion extending from the bottom portion to an upper region of the first opening. The extended portion has a smaller width than the bottom portion. A second lower conductive pattern is formed filling the second opening.

In other embodiments, forming substrate trenches includes etching the semiconductor substrate using the trench mask pattern as an etch mask. The first region is a memory array region of the memory device and the second region is a peripheral region of the memory device. The first lower conductive pattern is a word line of the memory device and the second lower conductive pattern is a gate electrode of a peripheral device of the memory device.

In further embodiments, the forming the first lower conductive pattern and forming the second lower conductive pattern include forming a first conductive layer having a thickness less than half of the width of the first opening on the semiconductor substrate in the first and second region. A second conductive layer is formed on the first conductive layer in the second region and filling the second opening. The first and second conductive layers are patterned to form the first lower conductive pattern is from the patterned first conductive layer and to form the second lower conductive pattern from the patterned first and second conductive layers.

In other embodiments, forming the first lower conductive pattern and forming the second lower conductive pattern include conformally depositing a first conductive layer having a thickness less than half of the width of the first opening on the semiconductor substrate in the first and second region. A sacrificial layer is formed on the first conductive layer. The sacrificial layer is etched to form a sacrificial layer pattern in the first opening including the first conductive layer and to remove the sacrificial layer from the second opening. A second conductive layer is formed on the first and second regions and filling the second opening after removing the sacrificial layer from the second opening. The second conductive layer and the first conductive layer are removed to expose a top surface of the device isolation layer patterns while leaving the first conductive layer in the first opening and the second opening and leaving the second conductive layer filling the second opening to form the second lower conductive pattern and the first lower conductive pattern. Removing the second conductive layer and the first conductive layer may include etching the second conductive layer and the first conductive layer until the top surface of the device isolation layer patterns are exposed.

In further embodiments, forming the first lower conductive pattern and forming the second lower conductive pattern are followed by removing the sacrificial layer pattern to expose the top surface of the first lower conductive pattern in the first opening. A dielectric layer is formed on the exposed top surface of the first lower conductive pattern in the first region. A third conductive layer is formed on the dielectric layer in the first region and in the second region. The third conductive layer, the dielectric layer, and the first lower conductive pattern are patterned to form a gate pattern across the active region in the first region. The third conductive layer, the first lower conductive pattern and the second lower conductive pattern are patterned to form a gate pattern across the active region in the second region.

In other embodiments, forming the sacrificial layer includes forming the sacrificial layer to a thickness equal to at least half of the width of the second opening including the first conductive layer so that the sacrificial layer fills the first and second openings. Etching the sacrificial layer includes etching the sacrificial layer until the first conductive layer is exposed to form the sacrificial layer pattern filling the first and second openings including the first conductive layer. A mask pattern is formed covering the first region and exposing the second region. The sacrificial layer pattern is removed from the second opening using the mask pattern as an etch mask. The mask pattern is removed to expose the sacrificial layer pattern filling the first opening. Forming the sacrificial layer may include conformally forming the sacrificial layer to a thickness of from about half of the width of the first opening including the first conductive layer to about half of the width of the second opening including the first conductive layer and etching the sacrificial layer may include isotropically etching the sacrificial layer using an etch recipe having an etch selectivity with respect to the first conductive layer until the first conductive layer is exposed to remove the sacrificial layer from the second opening and form the sacrificial layer pattern filling the first opening.

In yet further embodiments, forming the first lower conductive pattern and forming the second lower conductive pattern include forming a first conductive layer filling the first and second openings. The first conductive layer is etched until a top surface of the device isolation layer patterns is exposed to form the second lower conductive layer pattern filling the second opening. A mask pattern is formed on the etched first conductive layer and covering the first conductive layer in the second region. The first conductive layer pattern is recessed in the first region using the mask pattern as an etch mask to a depth selected to form the bottom portion having a top surface lower than the top surface of the device isolation layer pattern in the first region. The mask pattern is removed. A second conductive layer is formed to a thickness less than half of the width of the first opening on the first region and the second region after removing the mask pattern. The second conductive layer is anisotropically etched until the top surface of the device isolation layer patterns is exposed to form the extended portion on a sidewall of the first opening and contacting the bottom portion.

In further embodiments, forming the first lower conductive pattern and forming the second lower conductive pattern includes forming a first conductive layer filling the first and second openings. The first conductive layer is etched until a top surface of the device isolation layer patterns is exposed while leaving the first conductive layer in the first opening and in the second opening to form the second lower conductive layer pattern filling the second opening. A mask pattern is formed that covers the second lower conductive pattern and an interior of a top surface of the first conductive layer in the first opening and exposes a remainder of the top surface of the first conductive layer in the first opening. The exposed first conductive layer is anisotropically etched using the mask pattern as an etch mask to form the first lower conductive pattern in the first opening. The mask pattern is removed to expose the second lower conductive pattern.

In other embodiments, forming the first lower conductive pattern and forming the second lower conductive pattern includes forming a first conductive layer filling the first and second openings. The first conductive layer is etched until the top surface of the device isolation layer patterns is exposed while leaving the first conductive layer in the first opening and in the second opening to form the second lower conductive layer pattern filling the second opening. A mask pattern is formed that covers the second lower conductive pattern and an outer edge of a top surface of the first conductive layer in the first opening and exposes a remainder of the top surface of the first conductive layer in the first opening. The exposed first conductive layer is anisotropically etched using the mask pattern as an etch mask to form the first lower conductive pattern in the first opening. The mask pattern is removed to expose the second lower conductive pattern. Forming the first lower conductive pattern and forming the second lower conductive pattern may be followed by recessing a top surface of the device isolation layer pattern in the first region.

In yet other embodiments, nonvolatile memory device include first and second device isolation layer patterns in first and second regions of a semiconductor substrate that define respective first and second active regions. A first lower conductive pattern is disposed on the first active region and has a bottom portion and an extended portion extending upward from the bottom portion and having a smaller width than the bottom portion. A second lower conductive pattern is disposed on the second active region that is thicker than the bottom portion of the first lower conductive pattern. First and second upper conductive patterns are provided on the first and second lower conductive patterns and crossing over the respective first and second active regions. A gate interlayer insulating layer is interposed between the first lower conductive pattern and the first upper conductive pattern. A gate insulating layer may be provided between the semiconductor substrate and the first and second lower conductive patterns.

In other embodiments, the first region is a memory array region of the memory device and the second region is a peripheral region of the memory device. The first lower conductive pattern is a floating gate of a word line of the memory device. The first upper conductive pattern is a control gate of the word line and the second lower conductive pattern and the second upper conductive pattern are a gate electrode of a peripheral device of the memory device. The extended portion and the bottom portion may be a same conductive material. The extended portion may extend upward with respect to the semiconductor substrate to form a "U" shaped first lower conductive pattern. The width of the extended portion may be substantially the same as the thickness of the bottom portion. The extended portion may extend upward with respect to the semiconductor substrate from a center region of the bottom portion to form an "inverted T" shaped first lower conductive pattern. The width of the bottom portion may be greater than a width of the first active region.

In some embodiments, a top surface of the first device isolation layer pattern is lower than a top surface of the first lower conductive pattern. The top surface of the first device isolation layer pattern may be lower than a top surface of the second device isolation layer pattern. A top surface of the second device isolation layer pattern may be higher than a top surface of the bottom portion of the first lower conductive pattern. The second lower conductive pattern may include a stacked first conductive layer pattern and second conductive layer pattern. The first conductive layer pattern may have a same thickness as the bottom portion of the first lower conductive pattern. The first conductive layer pattern of the second lower conductive pattern may extend between the second device isolation layer pattern and the second conductive layer pattern of the second lower conductive pattern to define a "U" shaped section. The second conductive layer pattern may have substantially a same thickness as the extended portion of the first lower conductive pattern.

In other embodiments, opposite sidewalls of the second lower conductive pattern contact the second device isolation layer pattern and the second upper conductive pattern is disposed on the second lower conductive pattern and the second device isolation layer pattern. The gate interlayer insulating layer pattern may be interposed between the second lower conductive pattern and the second upper conductive pattern and have an opening formed on the second lower conductive pattern such that the second lower conductive pattern and the second upper conductive pattern directly contact each other.

BRIEF DESCRIPTION OF THE DRAWINGS

The accompanying drawings, which are included to provide a further understanding of the invention and are incorporated in and constitute a part of this application, illustrate exemplary embodiments of the invention and together with the description serve to explain the principle of the invention. In the drawings.

DETAILED DESCRIPTION OF THE INVENTION

Figure 1:
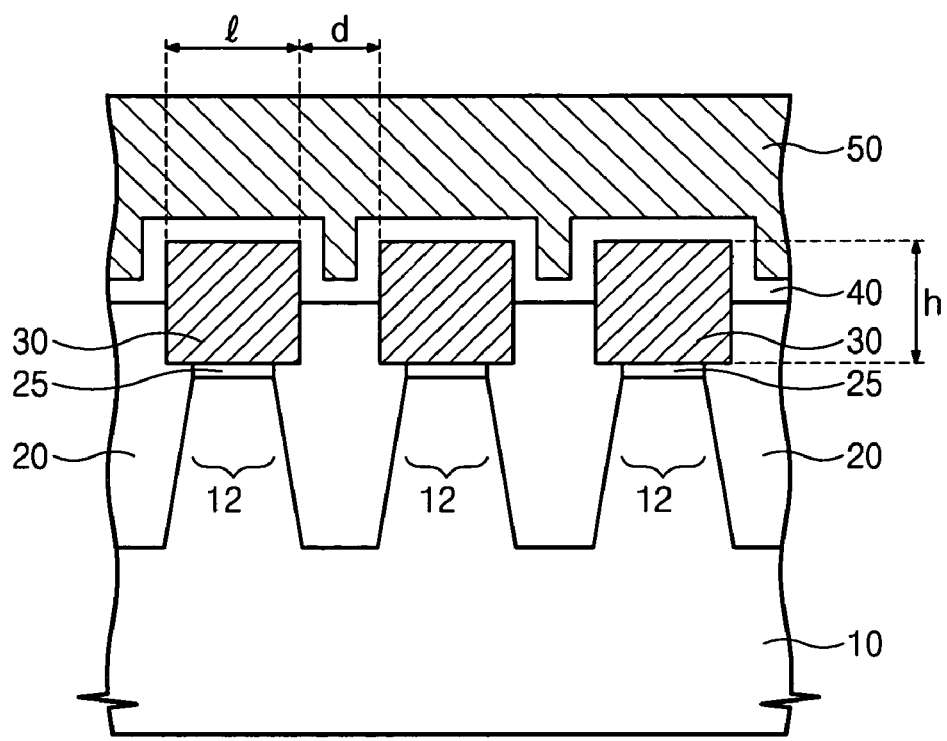
FIG. 1 is a cross sectional view illustrating a cell array of a conventional flash memory.
Figure 2:
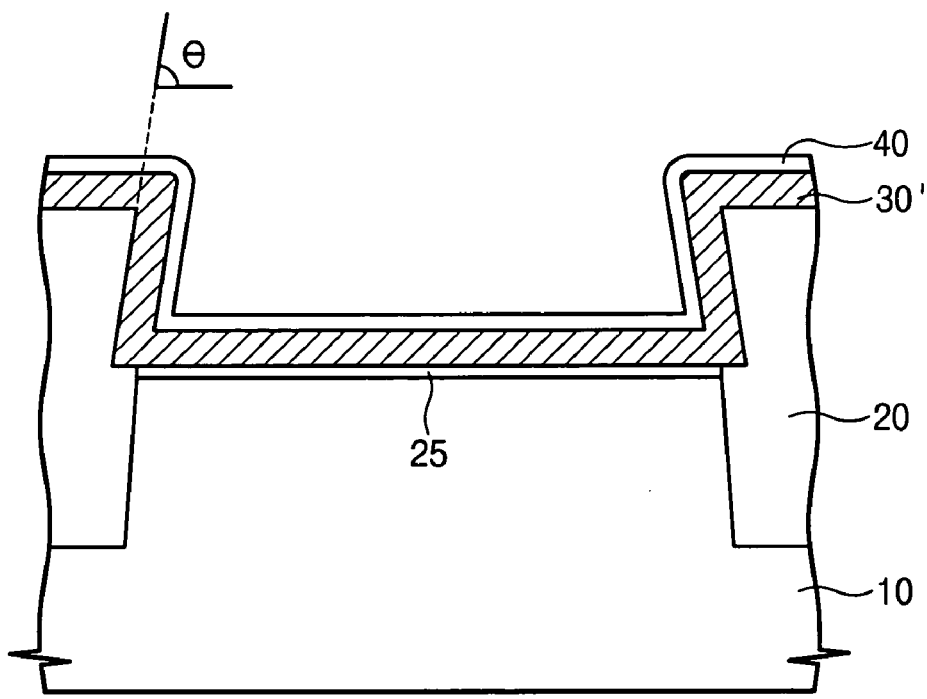
FIG. 2 is a cross sectional view illustrating a peripheral region of a conventional flash memory.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the present specification and the relevant art and will not be interpreted in an idealized or overly formal sense unless expressly so defined herein.

Figure 3A:
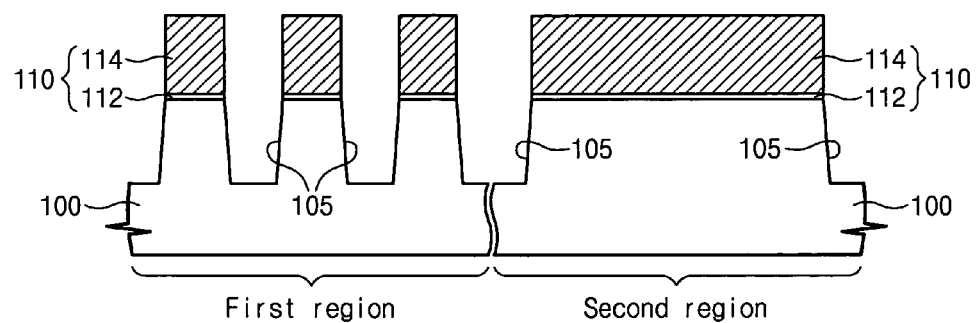
FIGS. 3A through 3J are cross sectional views illustrating a method of fabricating a nonvolatile memory device according to some embodiments of the present invention.

Various embodiments of the present invention will now be described with reference to FIGS. 3A through 3J. FIGS. 3A through 3J are cross sectional views illustrating a method of fabricating a nonvolatile memory device. Referring first to FIG. 3A, trench mask patterns 110 are shown formed on a semiconductor substrate 100 including a first region and a second region. The first region is a cell array region that includes a plurality of memory transistors, and the second region is a peripheral circuit region that includes a plurality of functional circuits connected electrically to the memory transistors. The trench mask patterns 110 may be formed, for example, of silicon nitride, silicon oxide and/or polysilicon. The trench mask patterns 110 may include a pad insulating layer 112, a mask insulating layer 114, and an anti-reflection layer that may be sequentially stacked. The pad insulating layer 112 may be formed of silicon oxide and the mask insulating layer 114 may be formed of silicon nitride.

Using the trench mask patterns 110 as an etch mask, the semiconductor substrate 100 may be anisotropically etched to form device isolation trenches 105 defining active regions. Consequently, the active regions correspond to regions of the semiconductor substrate 100 that are located under the trench mask patterns 110 during formation of the trenches 110s. Channel regions and source/drain regions of transistors may be formed in the active regions. At this point, the active region in the first region (hereinafter referred to as "the first active region") has a smaller width than the active region in the second region (hereinafter referred to as "the second active region").

Figure 3B:
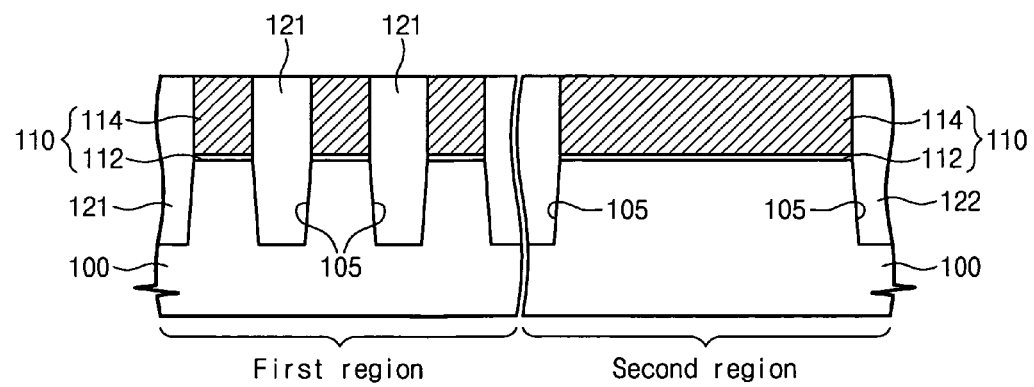

Referring next to FIG. 3B, a device isolation layer filling the device isolation trenches 105 is formed on the resulting structure including the first active region and the second active region. The device isolation layer may be formed, for example, of silicon oxide by chemical vapor deposition (CVD). The device isolation layer may be etched until the trench mask patterns 110 are exposed, thereby forming device isolation layer patterns 121 and 122 filling the device isolation trenches 105. Hereinafter, the device isolation layer patterns 121,122 formed in the first and second regions may be referred to as "first device isolation layer pattern 121" and "second device isolation layer pattern 122," respectively. The device isolation layer may be etched by a chemical mechanical polishing (CMP) process using an etch recipe having an etch selectivity with respect to the trench mask patterns 110. As used herein, "etching a layer B using an etch recipe having an etch selectivity with respect to a layer A" means "etching the layer B using an etch recipe that can minimize the etching of the layer A."

In some embodiments of the present invention, a thermal oxidation process for forming a silicon oxide layer (not illustrated) on an inner wall of the device isolation trench 105 may be further performed before the forming of the device isolation layer. The etching damage generated during the forming of the device isolation trenches 105 can be cured by the thermal oxidation process. In addition, after the thermal oxidation process, a liner layer (not illustrated) may be further formed on the entire surface of the resulting structure including the device isolation trenches 105, which may limit or even prevent a characteristic variation of the transistor due to impurity penetration. The liner layer may be formed, for example, of silicon nitride by CVD.

Figure 3C:
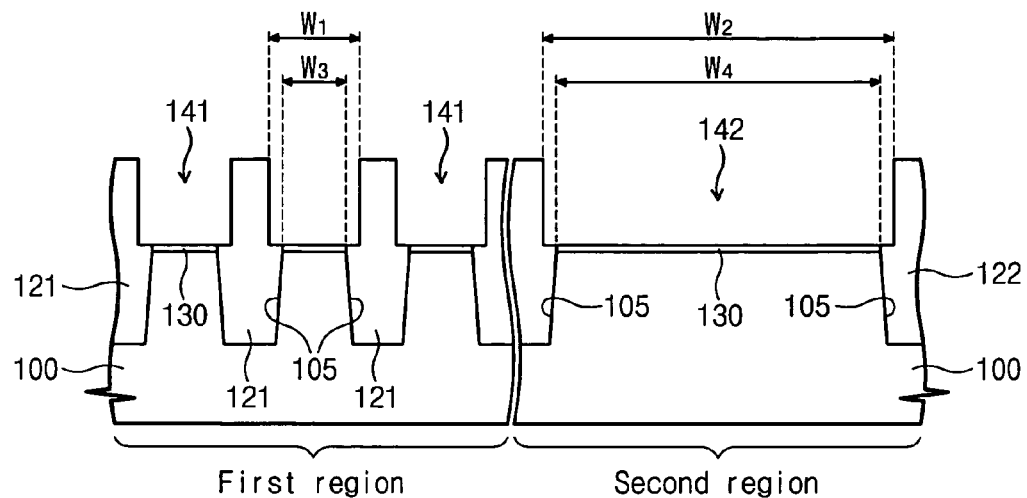

Referring now to FIG. 3C, the exposed trench mask patterns 110 are removed to form first openings 141 and a second opening 142 between the device isolation layer patterns 121 and 122. The first openings 141 expose the top surfaces of the first active regions, and the second opening 142 exposes the top surface of the second active region.

In some embodiments of the present invention, the removing of the trench mask patterns 110 includes etching the mask insulating layer 114 and the pad insulating layer 112. The etching of the mask insulating layer 114 may be performed using an etch recipe having an etch selectivity with respect to the device isolation layer patterns 121 and 122, and the etching of the pad insulating layer 112 may be performed using an etch recipe having an etch selectivity with respect to the semiconductor substrate 100. In order to limit or even prevent etching damage to the first and second active regions, both the mask insulating layer 114 and the pad insulating layer 112 may be removed by wet etching.

As described above, as the pad insulating layer 112 and the device isolation layer patterns 121 and 122 may all be formed of silicon oxide, the sidewalls of the device isolation layer patterns 121 and 122 may also be etched during the etching of the pad insulating layer 112. Consequently, as illustrated in FIG. 3C, the width $w_1$, of the first opening 141 and the width $w_2$ of the second opening 142 may become larger than the widths $w_3$ and $w_4$ of the trench mask patterns 110 (i.e., the widths of the top portions of the first and second active regions), respectively.

As illustrated in FIG. 3C, a gate insulating layer 130 is formed on the top surfaces of the first and second active regions. The thickness of the gate insulating layer 130 in the first region may be different from that in the second region. Furthermore, the thickness of the gate insulating layer 130 may vary within the second region. A nonvolatile memory device generally includes a variety of transistors that are different in various electrical characteristics, such as threshold voltages and breakdown voltages. The variety of the thicknesses of the gate insulating layer 130 may assist with satisfying the various electrical characteristic requirements for the respective transistors. The method of forming the thickness of the gate insulating layer 130 differently depending on regions and locations may include a plurality of thermal oxidation processes.

Figure 3D:
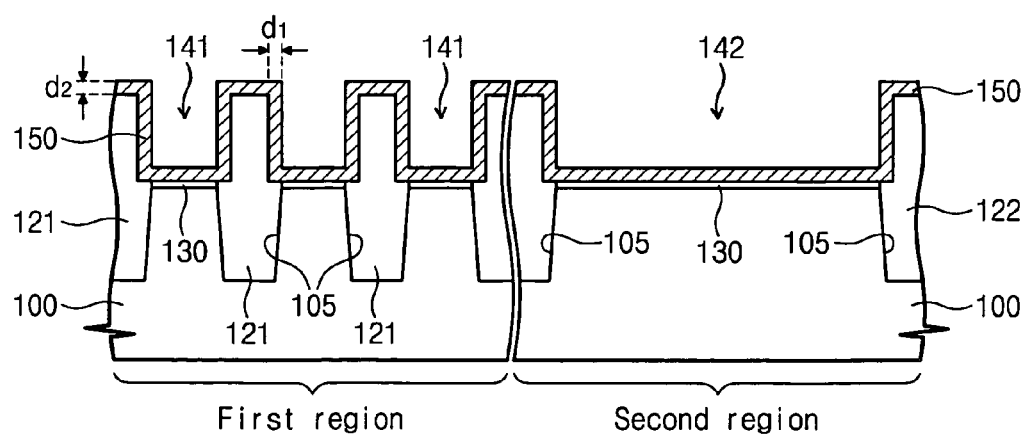

Referring now to FIG. 3D, a first conductive layer 150 is shown formed on the resulting structure including the gate insulating layer 130. In the illustrated embodiments, the thicknesses $d_1$ and $d_2$ of the first conductive layer 150 are smaller than half the width $w_1$ of the first opening 141, and may be about 10-30% of the width $w_1$.

In addition, the first conductive layer 150 may be formed to cover conformally the top surface of the gate insulating layer 130 and the top and exposed side surfaces of the device isolation layer patterns 121 and 122. That is, the thickness $d_1$ of the first conductive layer 150 deposited on the sidewalls of the device isolation layer patterns 121 and 122 may be approximately the same as the thickness $d_2$ of the first conductive layer 150 deposited on the top surfaces of the device isolation layer patterns 121 and 122 (for example, within an error range of 20%). For this conformal deposition, the first conductive layer 150 may be formed using a deposition technology with an excellent step coverage property. In some embodiments, the first conductive layer 150 may be formed using a CVD technology.

Figure 3E:
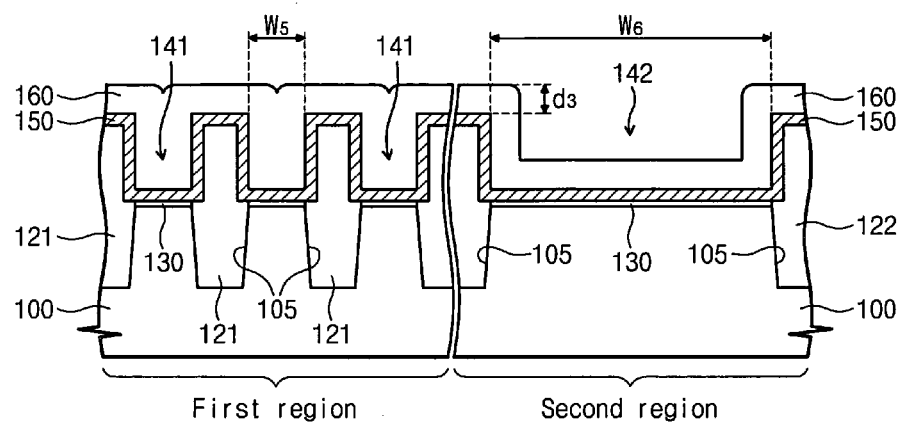

Referring to FIG. 3E, a sacrificial layer 160 is shown formed on the resulting structure including the first conductive layer 150. In the illustrated embodiments, the sacrificial layer 160 is formed to such a thickness as to completely fill the first opening 141 into which the first conductive layer 150 has been formed. To this end, the sacrificial layer 160 may be be formed thicker than the half of the thickness $w_5$ of the first opening 141 into which the first conductive layer 150 has been formed. In addition, the sacrificial layer 160 may be formed to such a thickness as to incompletely fill the second opening 142 into which the first conductive layer 150 has been formed. To this end, the sacrificial layer 160 may be formed thinner than the half of the thickness $w_6$ of the second opening 142 into which the first conductive layer 150 has been formed. Consequently, the thickness $d_3$ of the sacrificial layer 160 in some embodiments is in the range of about $w_5/2$ to $w_6/2$.

In order to limit or even prevent voids from being formed in the first opening 142, the sacrificial layer 160 may be formed using a deposition technology with an excellent step coverage property. In some embodiments, the sacrificial layer 160 is formed using a CVD technology. Accordingly, the sacrificial layer 160 conformally covers the inner wall of the second opening 142.

The sacrificial layer 160 may be formed of a material having an etch selectivity with respect to the first conductive layer 150. For example, the sacrificial layer 160 may be formed of a silicon oxide layer, a silicon nitride layer and/or a spin-on-glass (SOG) layer. At this point, for simplification of a subsequent gate insulating layer recessing process, the sacrificial layer 160 may be formed of the same material as the device isolation layer patterns 121 and 122. This will be described in detail later. In some embodiments, the sacrificial layer 160 is a silicon oxide layer that is formed using a low pressure (LP) CVD technology.

Figure 3F:
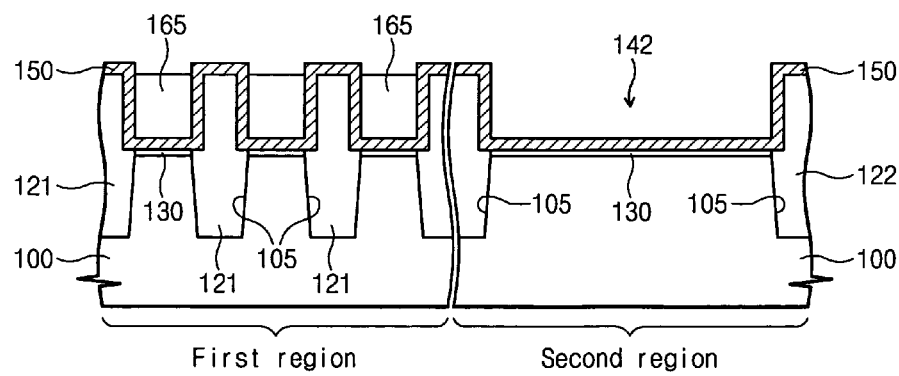

Referring now to FIG. 3F, the sacrificial layer 160 is shown after being etched until the first conductive layer 150 is exposed, thereby forming sacrificial layer patterns 165 filling the first openings 141. As the sacrificial layer 160 conformally covers the inner wall of the second opening 142 as described above, the sacrificial layer 160 in the second region is removed when the first conductive layer 150 in the first region is exposed.

The etching of the sacrificial layer 160 may be performed using an etch recipe having an etch selectivity with respect to the first conductive layer 150. In addition, to limit or even prevent the sacrificial layer 160 from remaining on the sidewalls of the second opening 142, the forming of the sacrificial layer patterns 165 may include isotropically etching the sacrificial layer 160 by over-etching. In some embodiments, the forming of the sacrificial layer patterns 165 includes etching the sacrificial layer 160 using a fluoric acid-containing etchant for a time of etching process that is determined considering the deposition thickness of the sacrificial layer 160. At this point, as the sacrificial layer patterns 165 are formed by a method of adjusting the widths of the first and second openings 141 and 142 and the deposition thickness of the sacrificial layer 160, an expensive photo process for forming this can be omitted.

Figure 3G:
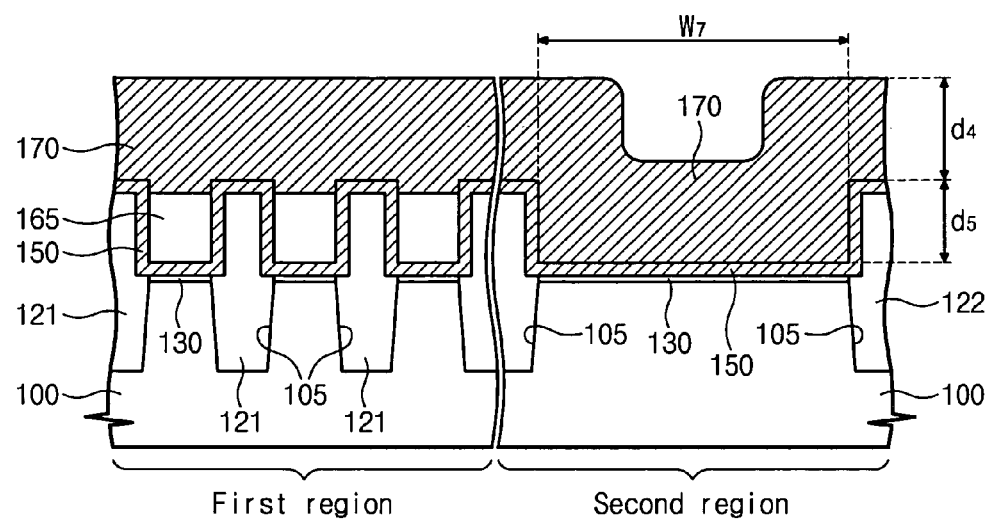

Referring next to FIG. 3G, a second conductive layer 170 is shown formed on the resulting structure including the sacrificial layer patterns 165. The second conductive layer 170 may be formed of a material having the same physical characteristics as the first conductive layer 150. For example, the first and second conductive layers 150 and 170 may be polysilicon layers that have the same impurity concentration and conductivity type. The second conductivity layer 170 may be formed of a material having different physical characteristics than the first conductive layer 150. For example, the first and second conductive layers 150 and 170 may be polysilicon layers that have different impurity concentrations and/or may be formed of different types of conductive materials.

In some embodiments, the second conductive layer 170 is formed to fill the second opening 142 (hereinafter referred to as "the second trench 142") exposing the first conductive layer 150. To this end, the thickness $d_4$ of the second conductive layer 170 may be greater than the depth $d_5$ of the second trench. When considering the conformal deposition thickness of the first conductive layer 150, the depth $d_5$ of the second trench may approximately correspond to the difference between the heights of the top surfaces of the gate insulating layer 130 and the second device isolation pattern 122. Meanwhile, when the depth $d_5$ of the second trench is greater than the width $w_7$ of the second trench, it is generally sufficient that the thickness $d_4$ of the second conductive layer 170 is greater than the half of the width $w_7$ of the second trench.

Figure 3H:
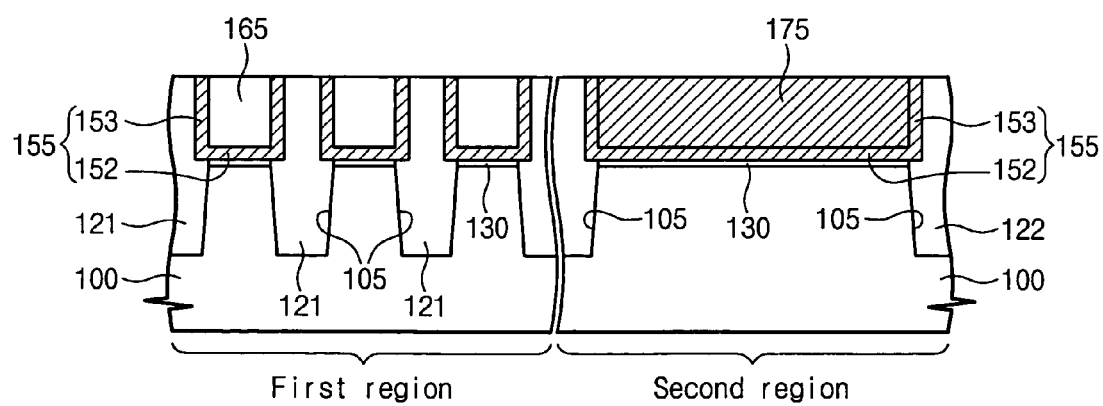

Referring now to FIG. 3H, the second conductive layer 170 and the first conductive layer 150 are shown after being sequentially etched by, for example, CMP, until the top surface of the first device isolation layer pattern 121 is exposed. Consequently, first lower conductive patterns are formed in the first openings 141, and a second lower conductive pattern is formed in the second opening 142. That is, as a result of the above etching, the first conductive layer 150 becomes first conductive layer patterns 155 covering the inner walls (i.e., the sidewalls and the bottom walls) of the first and second openings 141 and 142, and the second conductive layer 170 becomes a second conductive layer pattern 175 filling the inside of the first conductive layer pattern 155 in the second opening 142. At this point, the first conductive layer patterns 155 formed in the first openings 141 constitute the first lower conductive patterns, and the first and second conductive layer patterns 155 and 175 formed in the second opening 142 constitute the second lower conductive pattern.

Each of the illustrated first conductive layer patterns 155 has a bottom portion 152 and an extended portion 153 that form a U-shaped section. The bottom portions 152 fill the lower regions of the first and second openings 141 and 142, and the extended portions 153 extend upward from the bottom portions 152. That is, the extended portions 153 are disposed between the sacrificial layer pattern 165 and the first device isolation layer pattern 121 and between the second conductive layer pattern 175 and the second device isolation layer pattern 122. At this point, when considering the conformal deposition thickness of the first conductive layer 150, the thickness $d_2$ of the bottom portion 152 may be equal to the width $d_1$ of the extended portion 153 (See FIG. 3D). Also, the second conductive layer 170 is shown removed from the first region, thereby exposing the top surfaces of the sacrificial layer pattern 165 in the first region.

The top surface of the resulting structure including the first and second conductive layer patterns 155 and 175 may be planarized by the CMP. Accordingly, the conventional technical problems due to the step difference may be solved. Consequently, a subsequent photo process for gate patterning may be more easily performed.

Figure 3I:
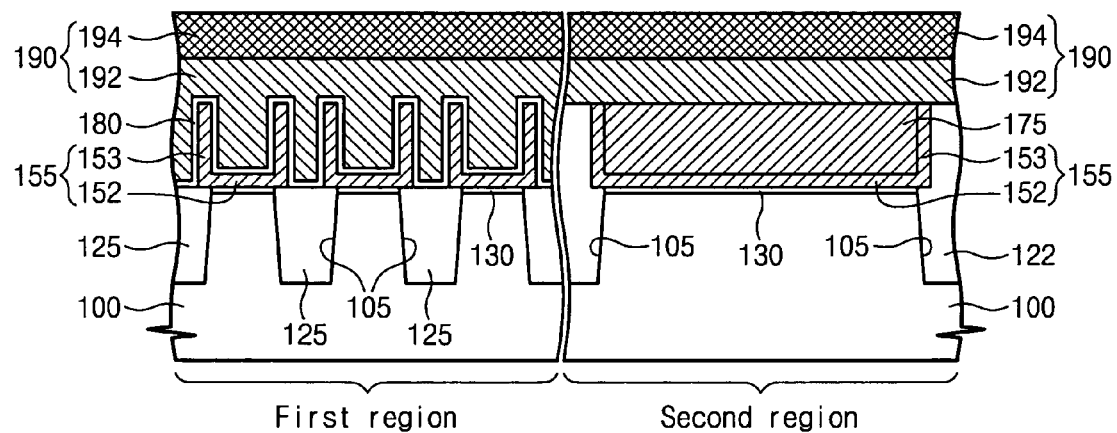

Referring to FIG. 3I, the top surfaces of the first device isolation layer patterns 121 in the first region are shown recessed to form recessed device isolation layer patterns 125 exposing the outer walls of the first conductive layer patterns 155 in the first region. In order to limit or even prevent the conventional problems due to the parasitic transistor, the above recessing process may be performed locally in the first region. That is, the top surface of the second device isolation layer pattern 122 is not recessed during the above recessing process. To this end, the above recessing process may be performed using an etch mask (e.g., photoresist patterns) covering the second region By the selective etching process for the first device isolation layer patterns 121, the top surface of the recessed device isolation layer pattern 125 becomes lower than the top surface of the second device isolation layer pattern 122 as illustrated in FIG. 3I.

Thereafter, the sacrificial layer patterns 165 are removed to expose the inner walls of the first conductive layer patterns 155. In some embodiments of the present invention, the removing of the sacrificial layer patterns 165 may be performed simultaneously with the recessing of the first device isolation layer patterns 121. For convenience in this process, the sacrificial layer 160 may be formed of the same material as the first and second device isolation layer patterns 121 and 122. In other embodiments of the present invention, the removing of the sacrificial layer patterns 165 may be performed before the recessing of the first device isolation layer patterns 121.

Thereafter, a gate interlayer insulating layer 180 and a third conductive layer 190 are shown sequentially formed to cover the exposed inner and outer walls of the first conductive layer patterns 155. The gate interlayer insulating layer 180 may be formed of a silicon oxide layer and/or a silicon nitride layer. The gate interlayer insulating layer 180 in some embodiments is formed of a silicon oxide layer, a silicon nitride layer and a silicon oxide layer, which are stacked sequentially. The gate interlayer insulating layer 180 has a contact region exposing the top surface of the first conductive layer pattern 155 or the second conductive layer pattern 175, so that the third conductive layer 190 can be electrically connected to the first conductive layer pattern 155 and/or the second conductive layer pattern 175. In some embodiments of a flash memory device, the contact region is formed in a peripheral circuit region and a region in which selected transistors are formed. In some embodiments, as illustrated in FIG. 3I, the gate interlayer insulating layer 180 may not remain in the second region.

The third conductive layer 190 may include a third lower conductive layer 192 and a third upper conductive layer 194. In the illustrated embodiments, the third lower conductive layer 192 may be formed of a polysilicon layer, and the third upper conductive layer 194 may be formed of a silicide layer and/or a metallic conductive layer.

Figure 3J:
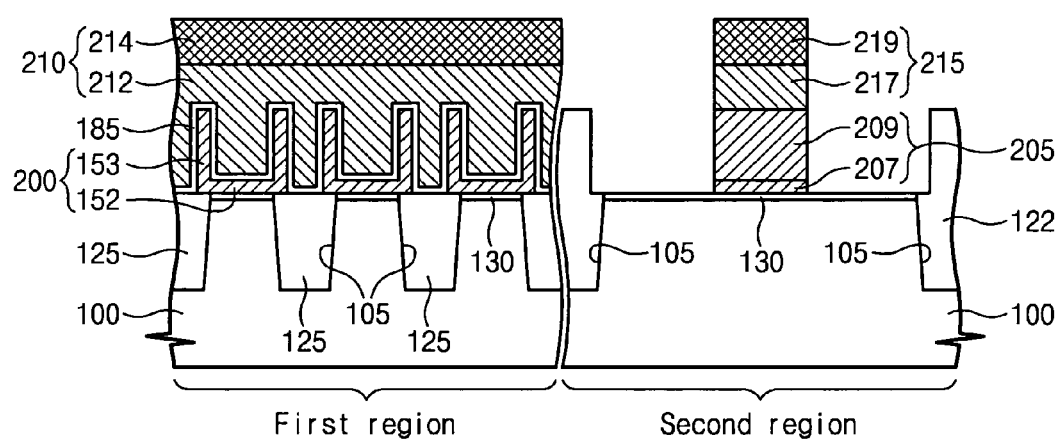

Referring to FIG. 3J, the third conductive layer 190, the gate interlayer insulating layer 180, the second conductive layer pattern 175, and the first conductive layer patterns 155 are shown patterned until the gate insulating layer 130 is exposed. Consequently, a wordline structure is formed in the first region, and a peripheral circuit gate structure is formed in the second region.

Figure 11A:
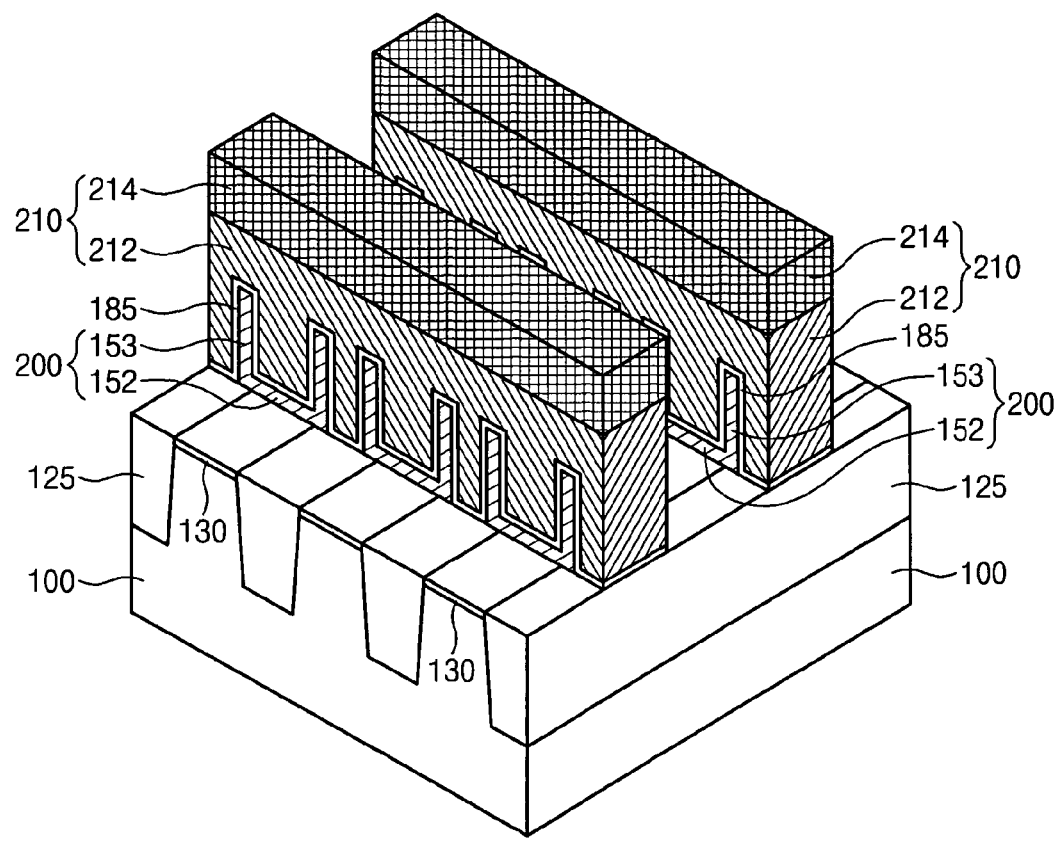
FIGS. 11A and 11B are perspective views of a region of a nonvolatile memory device according to some embodiments of the present invention.

FIG. 11A is a perspective view illustrating a portion of the first region of the nonvolatile memory including the wordline structure. Referring to FIGS. 3J and 11A, the wordline includes a floating gate electrode 200, a gate interlayer insulating layer pattern 185, and a control gate electrode 210 that are stacked sequentially. The floating gate electrode 200, the gate interlayer insulating layer pattern 185, and the control gate electrode 210 correspond to the etched structures of the first conductive layer pattern 155, the gate interlayer insulating layer 180, and the third conductive layer 190, respectively. Accordingly, the control gate electrode 210 may include a third lower conductive layer pattern 212 and a third upper conductive layer pattern 214 that correspond to the etched structures of the third lower conductive layer 192 and the third upper conductive layer 194, respectively.

Figure 12:
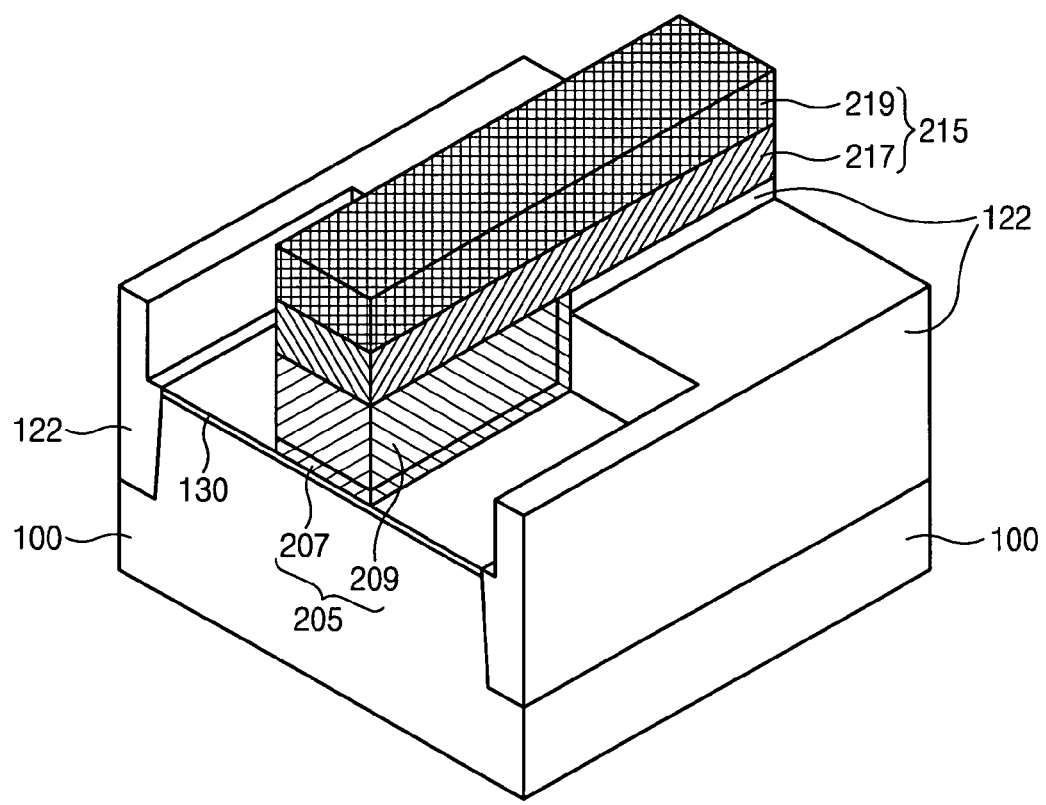
FIG. 12 is a perspective view of another region of a nonvolatile memory device according to some embodiments of the present invention.

FIG. 12 is a perspective view illustrating a portion of the second region of the nonvolatile memory device including the peripheral circuit gate structure. Referring to FIGS. 3J and 12, the peripheral circuit gate structure is used as a gate electrode of a transistor that is formed in the second region. The peripheral circuit gate structure includes a lower gate electrode 205 and an upper gate electrode 215 that are sequentially stacked and electrically connected to each other. The lower gate electrode 205 includes a first lower gate electrode 207 and a second lower gate electrode 209 that are stacked sequentially. The upper gate electrode 215 includes a first upper gate electrode 217 and a second upper gate electrode 219 that are stacked sequentially. The first and second lower gate electrodes 207 and 209 are respectively the etched structures of the second lower conductive patterns that include the first conductive pattern 155 and the second conductive pattern 175. The first and second upper gate electrodes 217 and 219 are, respectively, the etched structures of the third lower conductive layer 192 and the third upper conductive layer 194.

Figure 4:
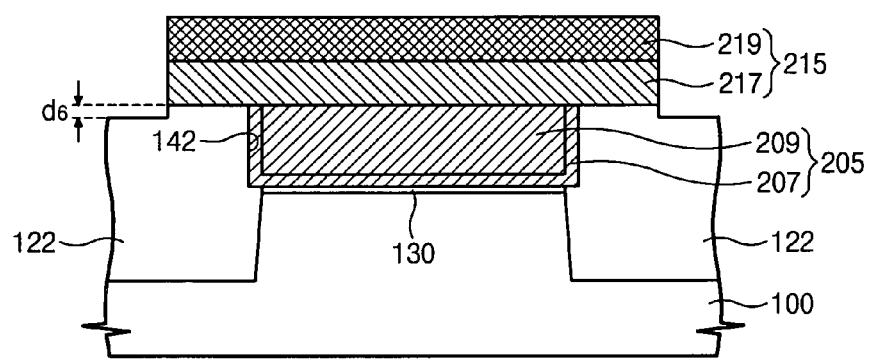
FIG. 4 is a cross sectional view illustrating a method of fabricating a nonvolatile memory device according to other embodiments of the present invention.

FIG. 4 is a cross sectional view illustrating a method of fabricating a nonvolatile memory device according to other embodiments of the present invention, which illustrates a section of the peripheral circuit gate structure that is perpendicular to the section illustrated in FIG. 3J. Referring to FIG. 4, the upper gate electrode 215 is disposed on the second device isolation pattern 122 to cover the top surface of the lower gate electrode 205. As described above, the second conductive layer pattern 175 fills the second opening 142 including the first conductive layer pattern 155 (See FIG. 3H). Accordingly, the second lower gate electrode 209 (i.e., the etched structure of the second conductive layer pattern 175) serves to limit or even eliminate the step difference of the second opening 142. Consequently, the top and/or bottom surface of the upper gate electrode 215 can be flat as illustrated in FIG. 4.

During the removing of the gate interlayer insulating layer 180 from the second region, the top surface of the second device isolation layer pattern 122 may be recessed to a predetermined depth. In this case, the bottom surface of the upper gate electrode 215 may have a step difference corresponding to the predetermined recess depth. In some embodiments, the predetermined recess depth (i.e., the step difference of the bottom surface of the upper gate electrode 215) may be about 10 to 200 Å.

In addition, a patterning process for forming the peripheral circuit gate structure may be performed using an etch recipe having an etch selectivity with respect to the gate insulating layer 130. At this point, the top surfaces of the first and second device isolation layer patterns 121 and 122 may be recessed as illustrated in FIG. 4. However, the top surface of the second device isolation layer pattern 122 is not recessed in a region under the peripheral circuit gate structure. Consequently, under the peripheral circuit gate structure, the height from the top surface of the gate insulating layer 130 to the top surface of the lower gate electrode 205 is approximately the same as the height from the top surface of the gate insulating layer 130 to the top surface of the second device isolation layer pattern 122 as seen in FIG. 4.

Figure 5A:
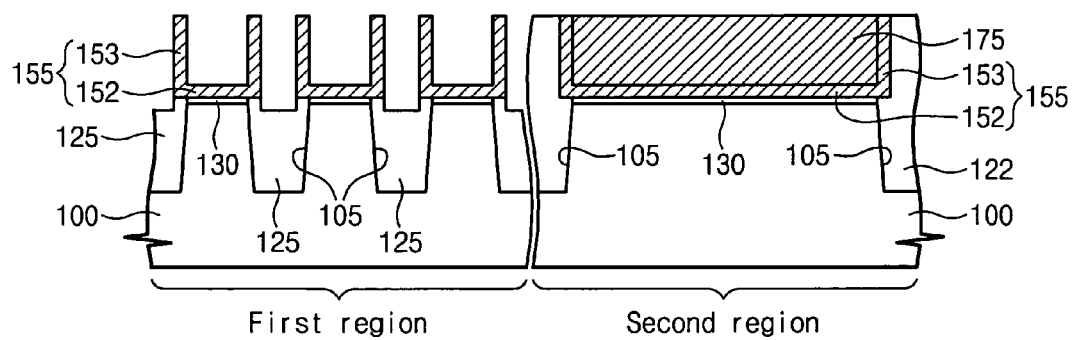
FIGS. 5A through 5C are cross sectional views illustrating a method of fabricating a nonvolatile memory device according to further embodiments of the present invention.
Figure 5B:
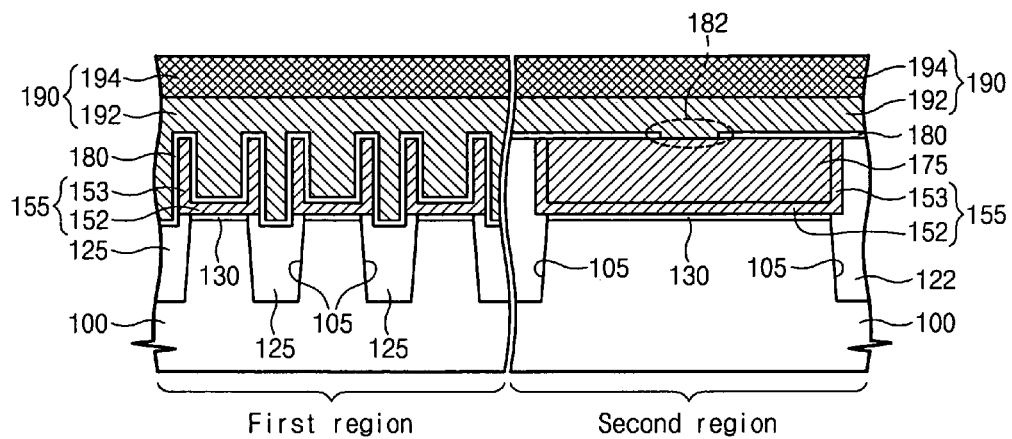
Figure 5C:
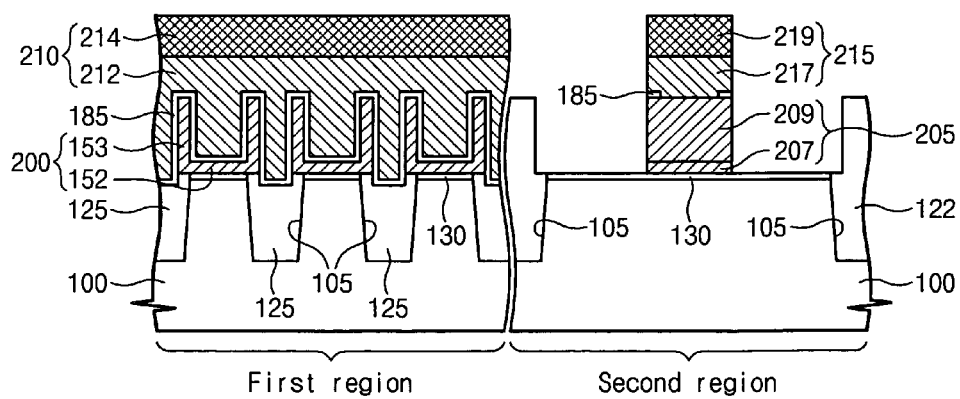

FIGS. 5A through 5C are cross sectional views illustrating a method of fabricating a nonvolatile memory device according to other embodiments of the present invention. As illustrated in FIG. 5A, the recessing of the first device isolation layer pattern 121 may be performed until the top surface of the first device isolation layer pattern 121 between the first conductive layer patterns 155 becomes lower than the top surface of the active region. Also, the gate interlayer insulating layer 180 may be incompletely removed from the second region. For example, as illustrated in FIGS. 5B and 5C, the gate interlayer insulating layer 180 may have a contact region 182 exposing a portion of the top surface of the second conductive layer pattern 175 at a place where the peripheral circuit gate structure is formed.

Figure 6A:
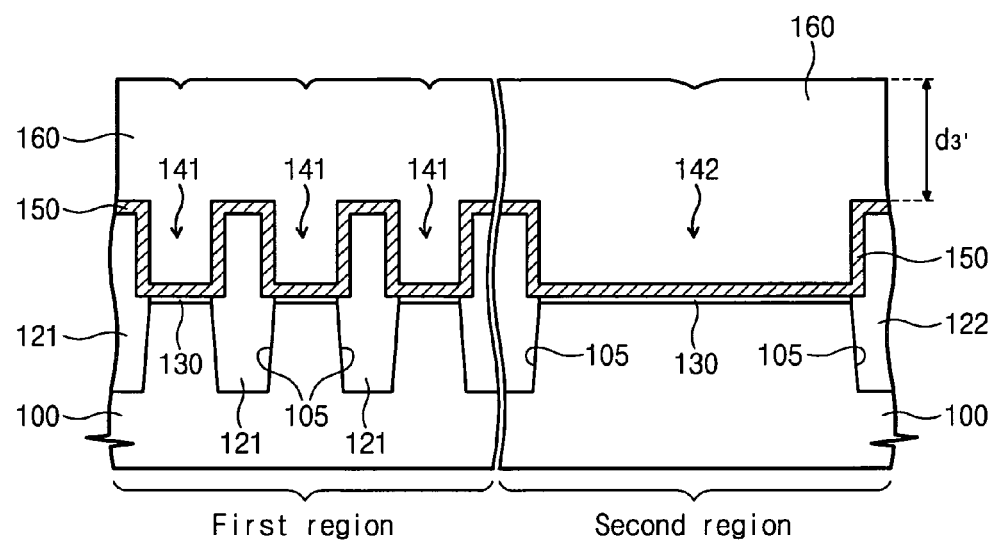
FIGS. 6A through 6C are cross sectional views illustrating a method of fabricating a nonvolatile memory device according to other embodiments of the present invention.
Figure 6B:
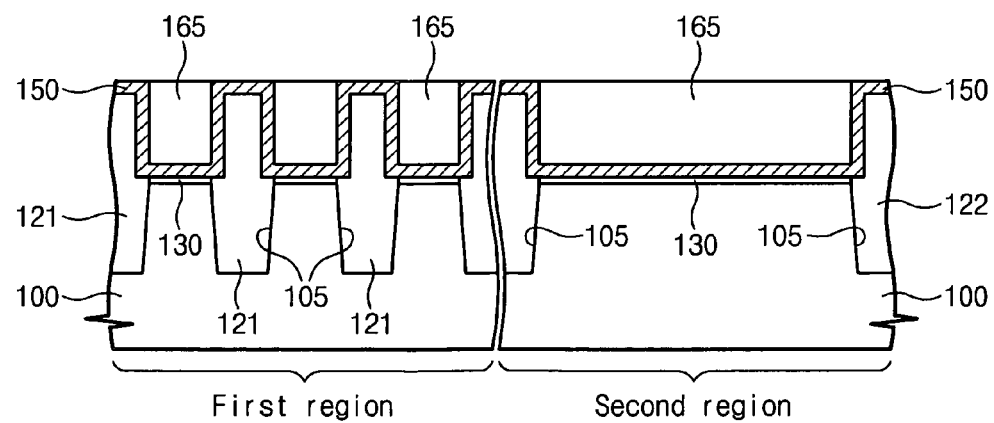
Figure 6C:
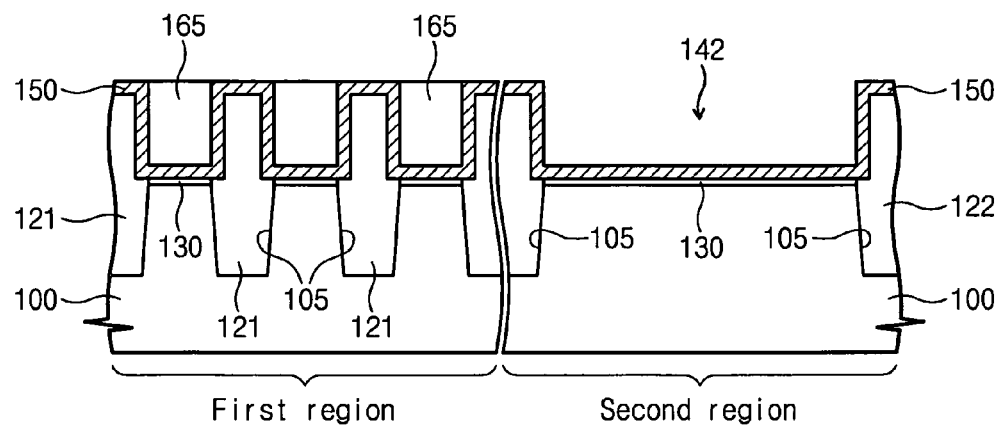

FIGS. 6A through 6C are cross sectional views illustrating a method of fabricating a nonvolatile memory device according to further embodiments of the present invention. Unlike the previously described embodiments, a sacrificial layer 160 is formed to completely fill the first and second openings 141 and 142 (compared to FIG. 3E showing a conformal layer 160 not filling the second opening 142). Descriptions of the like numbered items as described previously will not otherwise be further described in detail except where necessary to explain the embodiments of FIGS. 6A-6C.

Referring to FIG. 6A, after the first conductive layer 150 is formed, a sacrificial layer 160 is formed on the resulting structure to completely fill the first and second openings 141 and 142. To this end, the sacrificial layer 160 is formed thicker than the first and second openings 141 and 142 ($d_3' \geq d_5$).

Referring to FIG. 6B, the sacrificial layer 160 is etched and planarized until the top surface of the first conductive layer 150 is exposed on the device isolation layer patterns 121 and 122, thereby forming sacrificial layer patterns 165 filling the first and second openings 141 and 142. The etching of the sacrificial layer 160 may be performed using a CMP technology. Unlike the previously described embodiments, the sacrificial layer pattern 165 remains in the second opening 142 as well (compared to FIG. 3F, showing the layer 160 removed from the opening 142).

Referring to FIG. 6C, after a photoresist pattern (not illustrated) is formed on the first region, the sacrificial layer pattern 165 is removed from the second region using the photoresist pattern as an etch mask. Consequently, the surface of the first conductive layer 150 in the second opening 142 is completely exposed as illustrated in FIG. 6C. The removing of the sacrificial layer pattern 165 from the second region may be performed by a wet etching process using an etch recipe having an etch selectivity with respect to the first conductive layer 150 and the photoresist pattern.

Thereafter, the photoresist pattern is removed to expose the top surface of the first region in which the sacrificial layer pattern 165 remains. At this point, as with the previously described embodiments, the sacrificial layer pattern 165 remains in the first openings 141 but is removed from the second opening 142. Accordingly, subsequent processes including a process of forming the second conductive layer 170 can be performed in substantially the same manner as described with reference to the preceding embodiments.

As described above, in the embodiments of FIGS. 3A to 5C, the sacrificial layer 160 may be over-etched to completely remove the sacrificial layer 160 from the second opening 142, such that the thickness of the sacrificial layer pattern 165 may be smaller than the depth of the first opening 141. On the other hand, in the embodiments of FIG. 6A-6C, the sacrificial layer pattern 165 may be formed such that its height is approximately the same as the depth of the first opening 141. At this point, since the height of the sacrificial layer pattern 165 is a process parameter determining the height of the floating gate electrode 200 (FIG. 3J), the embodiments of FIGS. 6A-6C may limit or even prevent a reduction in the height of the floating gate electrode 200.

Figure 7:
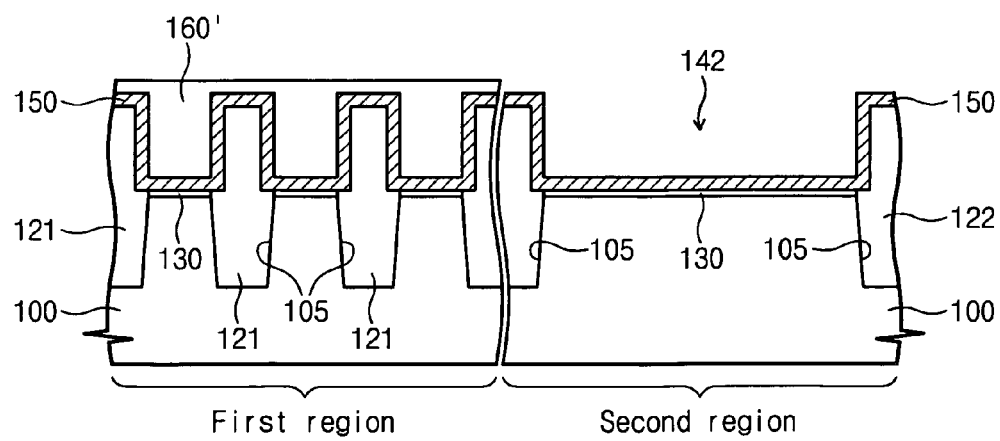
FIG. 7 is a cross sectional view illustrating a method of fabricating a nonvolatile memory device according to further embodiments of the present invention.

FIG. 7 is a cross sectional view illustrating a method of fabricating a nonvolatile memory device according to further embodiments that are a variation on the embodiments of FIGS. 6A-6C. Referring to FIGS. 6A and 7, after a sacrificial layer 160 completely filling the first and second openings 141 and 142 is formed, the sacrificial layer 160 is overall etched to form a recessed sacrificial layer 160' that does not expose the first conductive layer 150. Thereafter, a photolithographic etching process is performed to remove the recessed sacrificial layer 160' from the second region, thereby exposing the second opening 142 as shown in FIG. 7. Likewise, subsequent processes including a process of forming the second conductive layer 170 may be performed as described for previous embodiments. For the embodiments of FIG. 7, a reduction in the height of the floating gate electrode 200 may be limited or even prevented more effectively.

FIGS. 8A through 8E are cross sectional views illustrating a method of fabricating a nonvolatile memory device according to yet further embodiments of the present invention. Unlike the foregoing embodiments, the first conductive layer 150 is formed to fill the first and second openings 141 and 142. Descriptions of like numbered elements will not be described again in detail except as required to explain the embodiments of FIGS. 8A-8E.

Figure 8A:
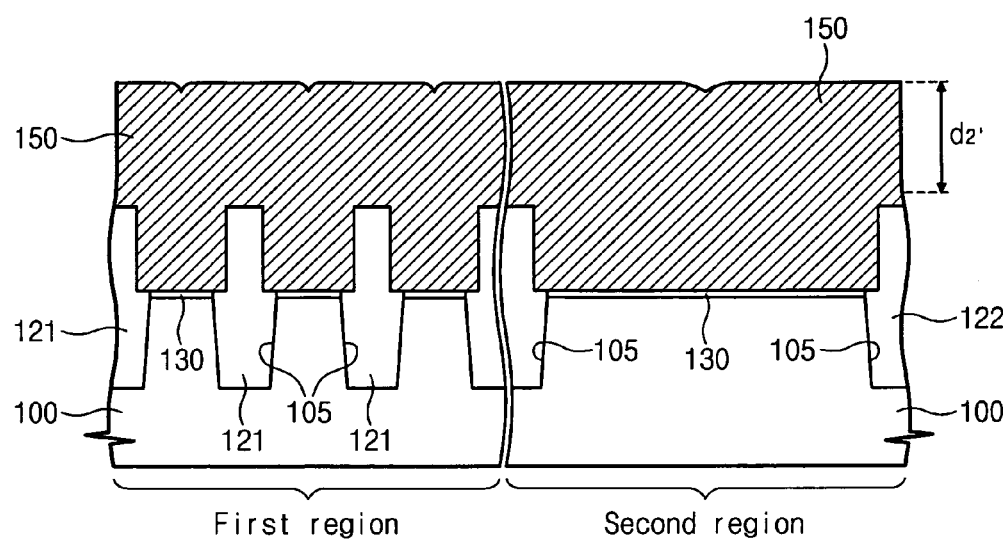
FIGS. 8A through 8E are cross sectional views illustrating a method of fabricating a nonvolatile memory device according to yet other embodiments of the present invention.

Referring to FIG. 8A, after a gate insulating layer 130 is formed, a first conductive layer 150 is formed on the resulting structure to completely fill the first and second openings 141 and 142. To this end, the first conductive layer 150 is formed thicker than the first and second openings 141 and 142 ($d_2' \geq d_5$).

Figure 8B:
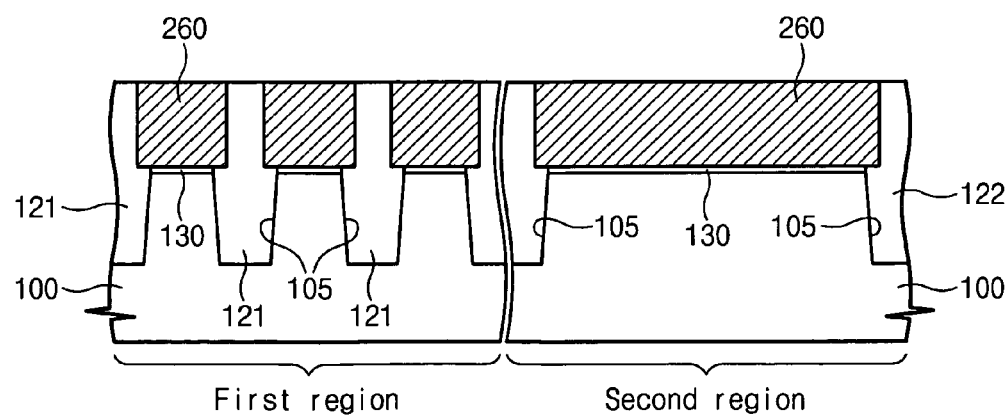

Referring to FIG. 8B, the first conductive layer 150 may be etched and/or planarized until the top surfaces of the device isolation layer patterns 121 and 122 are exposed, thereby forming first conductive layer patterns 260 filling the first and second openings 141 and 142. The planarization etching of the first conductive layer 150 may be performed using a CMP technology. Unlike the previously described embodiments, the first conductive layer pattern 260 completely fills the first and second openings 141 and 142.

Figure 8C:
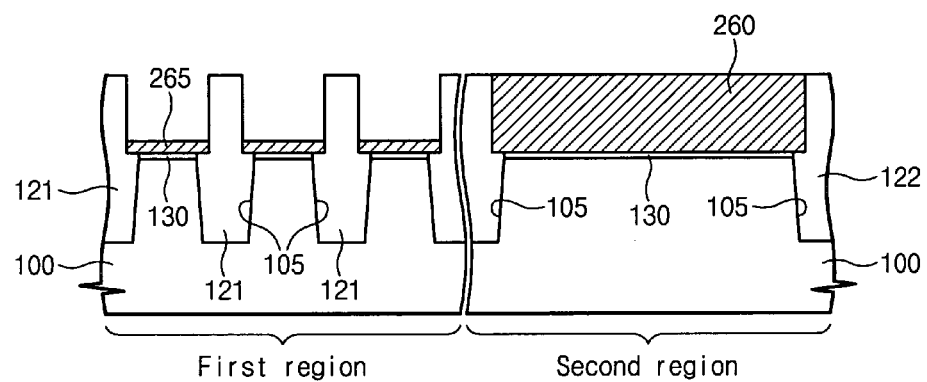

Referring to FIG. 8C, a mask pattern (not illustrated), such as a photoresist pattern, which exposes the first region while covering the second region, is formed on the resulting structure including the first conductive layer patterns 260. Thereafter, using the mask pattern as an etch mask, the first conductive layer patterns 260 are recessed in the first region, thereby forming bottom patterns 265 having lower top surfaces than the first device isolation layer patterns 121. The thickness of the bottom pattern 265 may be smaller than half of the depth of the first opening 141, and, in some embodiments, is about 5-30% of the depth of the first opening 141.

Figure 8D:
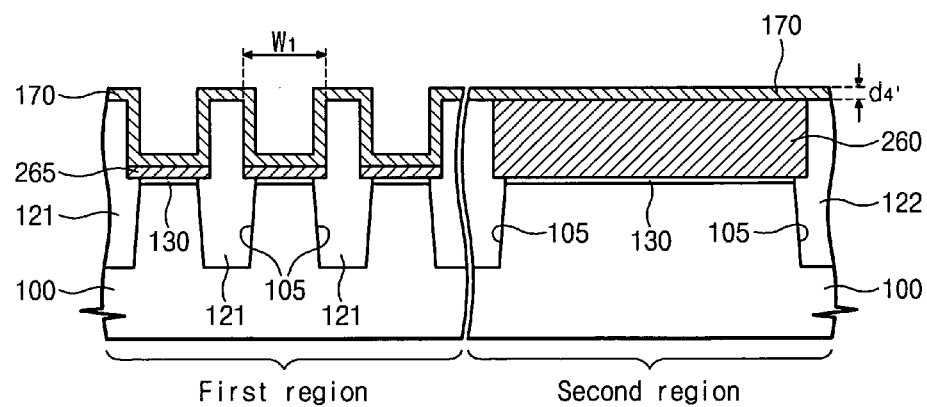

Referring to FIG. 8D, after the mask pattern is removed, a second conductive layer 170 contacting the top surfaces of the bottom patterns 265 is formed on the resulting structure. In the embodiments of FIG. 8D, the thickness $d_4'$ of the second conductive layer 170 may be smaller than half of the width $w_1$ of the first opening 141, and, in some embodiments, is about 10-30% of the width $w_1$. Due to this deposition thickness, the second conductive layer 170 incompletely fills the first openings 141 in which the bottom patterns 265 have been formed.

In addition, the second conductive layer 170 conformally covers the top surfaces of the bottom patterns 265 and the exposed side surfaces of the first device isolation layer patterns 121. For this conformal deposition, the second conductive layer 170 may be formed using a deposition technology with an excellent step coverage property. In some embodiments, the second conductive layer 170 is formed using a CVD technology.

Figure 8E:
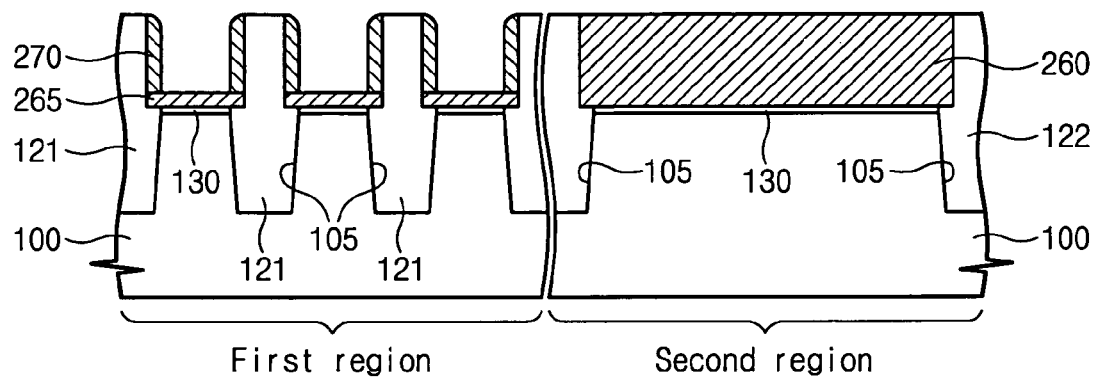

Referring to FIG. 8E, the second conductive layer 170 is shown anisotropically etched until the top surfaces of the first device isolation layer patterns 121 are exposed. Accordingly, extended patterns 270 contacting the bottom patterns 265 are formed on the sidewalls of the first device isolation layer patterns 121. The forming of the extended patterns 270 may be performed using an overall etching process. In this case, the second conductive layer 170 may be removed from the second region, thereby exposing the top surface of the first conductive layer pattern 260 in the second region as seen in FIG. 8E.

In the illustrated embodiments of FIG. 8E, the bottom patterns 265 and the extended patterns 270 in the first openings 141 correspond to the first lower conductive patterns in the previously described embodiments. Likewise, the first conductive layer pattern 260 in the second opening 141 corresponds to the second lower conductive layer pattern in the previously described embodiments. Thereafter, subsequent processes including a process of forming the gate interlayer insulating layer 180 may be performed in substantially the same manner as described for the previous embodiments.

Figure 9A:
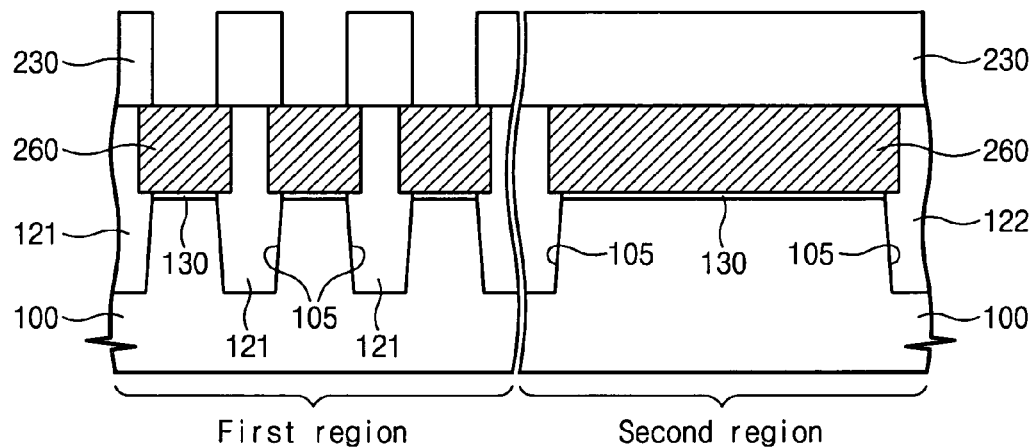
FIGS. 9A and 9B are cross sectional views illustrating a method of fabricating a nonvolatile memory device according to further embodiments of the present invention.
Figure 9B:
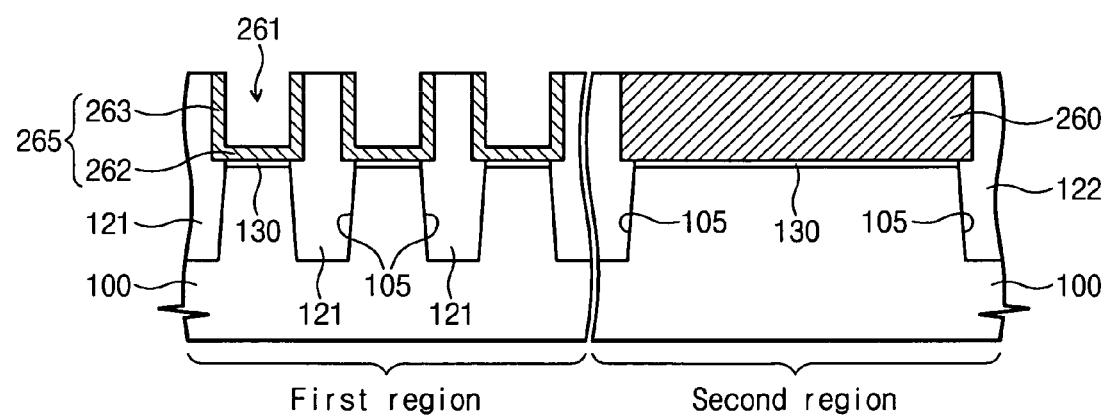

FIGS. 9A and 9B are cross sectional views illustrating a method of fabricating a nonvolatile memory device according to yet other embodiments of the present invention. Unlike the previously described embodiments, the first lower conductive layer patterns are formed using a photolithographic etching process. Detailed descriptions of the like number items as the previously described embodiments will not be further described herein except as needed to explain the embodiments of FIGS. 9A and 9B.

Referring to FIG. 9A, first conductive layer patterns 260 are formed to fill the first and second openings 141 and 142. The forming of the first conductive layer patterns 260 may be performed in substantially the same manner as described with reference to FIGS. 8A and 8B. Thereafter, a mask pattern 230 covering the second region is formed on the resulting structure including the first conductive layer patterns 260. The mask pattern may be a photoresist pattern that is formed by a photo process. At this point, the mask pattern 230 is formed to cover the top edge surface of the first conductive layer pattern 260 in the first region. That is, the top center surface of the first conductive layer pattern 260 is not covered by the mask pattern 230 in the first region. In the first region, the entire top surface of the first device isolation layer pattern 121 may be covered by the mask pattern 230.

Referring to FIG. 9B, the exposed top center surface of the first conductive layer pattern 260 in the first region may be etched and recessed using the mask pattern 230 as an etch mask. At this point, the recess depth of the first conductive layer pattern 260 is smaller than the depth of the first opening 141. Consequently, a gap region 261 is formed at the center of the first opening 141, and the first conductive layer pattern 260 remains at the bottom of the gap region 261. This remaining portion is the bottom portion 262 of a first lower conductive pattern 265.

Also, a portion not etched in the above etching process, that is, the first conductive layer pattern 260 under the mask pattern 230, is an extended portion 263 of the first lower conductive pattern 265. The edge of the gap region 261 is defined by the extended portion 263. Consequently, the first lower conductive pattern 265 having the bottom portion 262 and the extended portion 263 is substantially the same as described for the patterns 155 with reference to FIG. 3H.

The first conductive layer pattern 260 in the second region, which is not etched, corresponds to the second lower conductive pattern in the embodiments of FIGS. 3A-3J. In the embodiments of FIGS. 3A-3J, the second lower conductive pattern has a two-layer structure (See FIG. 3H). However, in the embodiments of FIGS. 9A-9B, the second lower conductive pattern (i.e., the second conductive layer pattern 260 of the second region) has a single-layer structure.

Figure 10A:
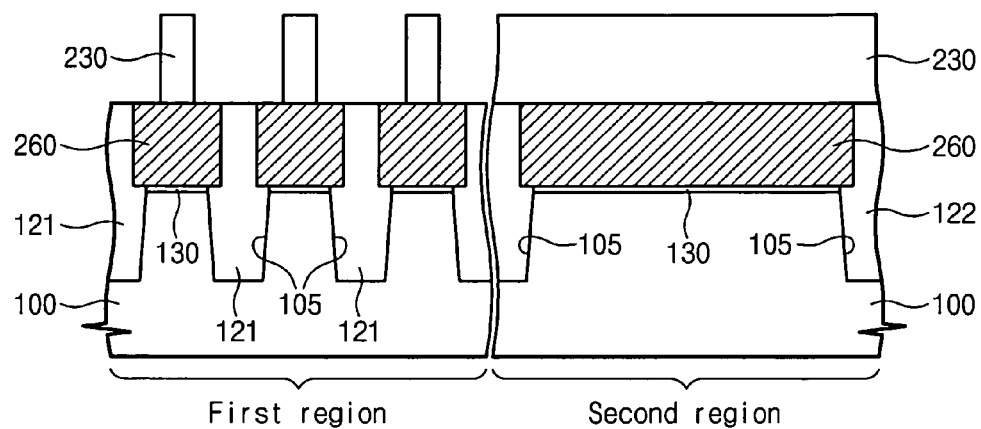
FIGS. 10A and 10B are cross sectional views illustrating a method of fabricating a nonvolatile memory device according to other embodiments of the present invention.
Figure 10B:
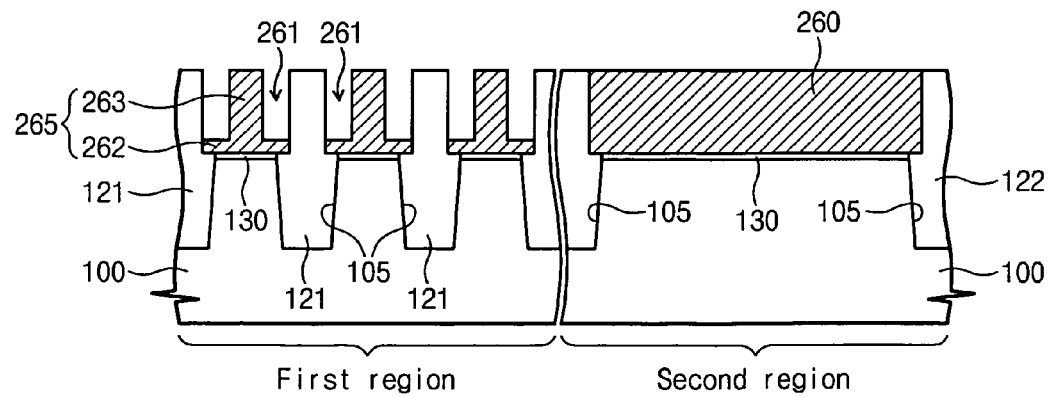
Figure 11B:
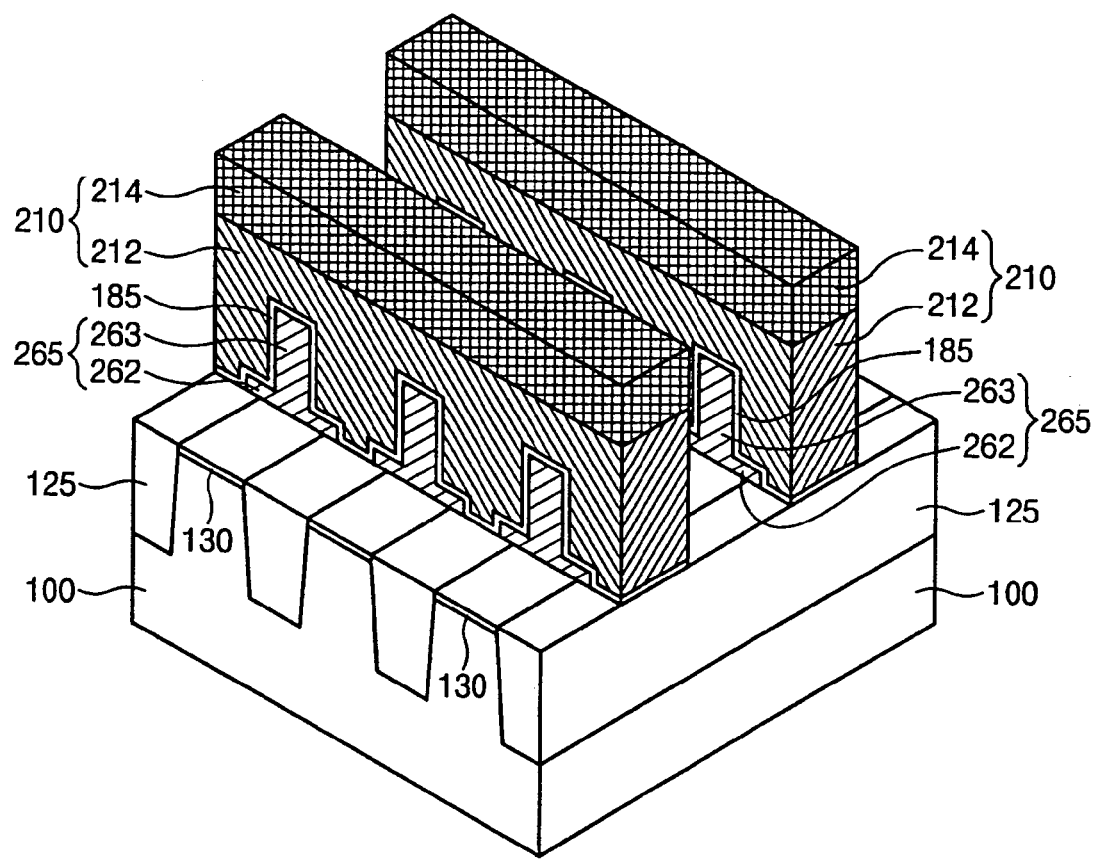

FIGS. 10A and 10B are cross sectional views illustrating a method of fabricating a nonvolatile memory device according to further embodiments that are a variation on the embodiments of FIGS. 9A-9B. These modified embodiments differ from the embodiments of FIGS. 9A-9B in respect of the formation position of the mask pattern and the corresponding shape of the first lower conductive pattern. FIG. 11B is a perspective view of a wordline structure corresponding to the embodiments of FIG. 10A-10B.

Referring to FIGS. 10A and 11B, the mask pattern 230 covers the top center surface of the first conductive layer pattern 260 in the first region and the whole of the second region. Consequently, the gap region 261 is formed near the first device isolation layer pattern 121. The extended portion 263 is extended upward from the bottom portion 262 while being surrounded by the gap region 261 (See FIGS. 10B and 11B).

As described above, the floating gate electrode 200, 265 of the memory cell transistor may have a "U" or "inverted T" shaped section. Accordingly, the area of the section of the floating gate electrode can be reduced and, thus, an interference with an adjacent wordline can be reduced or minimized. The minimized interference can afford a process margin that allows an increase in the surface area of the floating gate electrode. Accordingly, the floating gate electrode according to some embodiments of the present invention can increase a coupling ratio without increasing the interference. Consequently, the nonvolatile memory device according to some embodiments of the present invention can limit or even prevent a decrease in the coupling ratio and an electrical interference due to its high integration.

Also, according to some embodiments of the present invention, the upper space (i.e., the second opening 142) of the active region is completely filled with the conductive layer pattern before the gate interlayer insulating layer is formed. Accordingly, the gate interlayer insulating layer may be formed on the resulting structure of the peripheral circuit region whose top surface is planarized. Consequently, the gate interlayer insulating layer can be etched without an overetching process performed in the prior art. Therefore, it is possible to limit or even prevent the recess of the device isolation layer pattern and the corresponding formation of the parasitic transistor. Also, it is possible to limit or even prevent the formation of the conductive residue or the residue of the gate interlayer insulating layer on the negatively-sloped sidewalls of the device isolation layer pattern. Consequently, it is possible to form the floating gate electrode with the "U" or "inverted T" shaped section without causing the technical problems related to the peripheral circuit region.

As described above, some embodiments of the present invention provide methods of fabricating nonvolatile memory devices wherein gate electrodes disposed respectively in wide and narrow active regions are formed to have different structures. In some embodiments, nonvolatile memory devices are characterized in that gate electrodes disposed respectively in wide and narrow active regions have different structures.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A nonvolatile memory device comprising:
   first and second device isolation layer patterns in first and second regions of a semiconductor substrate that define respective first and second active regions;
   a first lower conductive pattern disposed on the first active region and having a bottom portion and an extended portion extending upward from the bottom portion and having a smaller width than the bottom portion;
   a second lower conductive pattern disposed on the second active region that is thicker than the bottom portion of the first lower conductive pattern;
   first and second upper conductive patterns on the first and second lower conductive patterns and crossing over the respective first and second active regions; and
   a gate interlayer insulating layer interposed between the first lower conductive pattern and the first upper conductive pattern,
   wherein the second lower conductive pattern includes a stacked first conductive layer pattern and second conductive layer pattern, wherein the first conductive layer pattern has a same thickness as the bottom portion of the first lower conductive pattern, and
   wherein a continuous top surface of the second conductive layer pattern in the second active region is substantially flat.

2. The non-volatile memory device of claim 1, further comprising a gate insulating layer between the semiconductor substrate and the first and second lower conductive patterns and wherein the first region comprises a memory array region of the memory device and wherein the second region comprises a peripheral region of the memory device and wherein the first lower conductive pattern comprises a floating gate of a word line of the memory device, the first upper conductive pattern comprises a control gate of the word line and the second lower conductive pattern and the second upper conductive pattern comprise a gate electrode of a peripheral device of the memory device.

3. The nonvolatile memory device of claim 1, wherein the extended portion and the bottom portion comprises a same conductive material.

4. The nonvolatile memory device of claim 1, wherein the extended portion extends upward with respect to the semiconductor substrate to form a "U" shaped first lower conductive pattern.

5. The nonvolatile memory device of claim 4, wherein the width of the extended portion is substantially the same as the thickness of the bottom portion.

6. The nonvolatile memory device of claim 1, wherein the extended portion extends upward with respect to the semiconductor substrate from a center region of the bottom portion to form an "inverted T" shaped first lower conductive pattern.

7. The nonvolatile memory device of claim 1, wherein the width of the bottom portion is greater than a width of the first active region.

8. The nonvolatile memory device of claim 1, wherein a top surface of the first device isolation layer pattern is lower than a top surface of the first lower conductive pattern.

9. The nonvolatile memory device of claim 1, wherein a top surface of the first device isolation layer pattern is lower than a top surface of the second device isolation layer pattern.

10. The nonvolatile memory device of claim 1, wherein a top surface of the second device isolation layer pattern is higher than a top surface of the bottom portion of the first lower conductive pattern.

11. The nonvolatile memory device of claim 1, wherein the first conductive layer pattern of the second lower conductive pattern extends between the second device isolation layer pattern and the second conductive layer pattern of the second lower conductive pattern to define a "U" shaped section.

12. The nonvolatile memory device of claim 1, wherein the second conductive layer pattern has substantially a same thickness as the extended portion of the first lower conductive pattern.

13. The nonvolatile memory device of claim 1, wherein opposite sidewalls of the second lower conductive pattern contact the second device isolation layer pattern and the second upper conductive pattern is disposed on the second lower conductive pattern and the second device isolation layer pattern.

14. The nonvolatile memory device of claim 1, wherein the gate interlayer insulating layer pattern is interposed between the second lower conductive pattern and the second upper conductive pattern and has an opening formed on the second lower conductive pattern such that the second lower conductive pattern and the second upper conductive pattern directly contact each other.

15. A nonvolatile memory device comprising:
    first and second device isolation layer patterns in first and second regions of a semiconductor substrate and extending in a first direction, that define respective first and second active regions;
    a first lower conductive pattern disposed on the first active region and having a bottom portion and an extended portion extending upward from the bottom portion and having a smaller width than the bottom portion;
    a second lower conductive pattern disposed on the second active region that is thicker than the bottom portion of the first lower conductive pattern;
    first and second upper conductive patterns on the first and second lower conductive patterns and crossing over the respective first and second active regions; and
    a gate interlayer insulating layer interposed between the first lower conductive pattern and the first upper conductive pattern,
    wherein widths of the second lower conductive pattern and the second upper conductive pattern are substantially equal with each other on the second active region,
    wherein the widths are taken in a second direction that is different from and substantially perpendicular to the first direction
    wherein the second lower conductive pattern includes a stacked first conductive layer pattern and second conductive layer pattern, wherein the first conductive layer pattern has a same thickness as the bottom portion of the first lower conductive pattern, and
    wherein a continuous top surface of the second conductive layer pattern in the second active region is substantially flat.

16. The non-volatile memory device of claim 15, further comprising a gate insulating layer between the semiconductor substrate and the first and second lower conductive patterns and wherein the first region comprises a memory array region of the memory device and wherein the second region comprises a peripheral region of the memory device and wherein the first lower conductive pattern comprises a floating gate of a word line of the memory device, the first upper conductive pattern comprises a control gate of the word line and the second lower conductive pattern and the second upper conductive pattern comprise a gate electrode of a peripheral device of the memory device.

17. The nonvolatile memory device of claim 15, wherein the extended portion and the bottom portion comprises a same conductive material.

18. The nonvolatile memory device of claim 15, wherein the extended portion extends upward with respect to the semiconductor substrate to form a "U" shaped first lower conductive pattern.

19. The nonvolatile memory device of claim 15, wherein the second conductive layer pattern has substantially a same thickness as the extended portion of the first lower conductive pattern, and
    wherein opposite sidewalls of the second lower conductive pattern contact the second device isolation layer pattern and the second upper conductive pattern is disposed on the second lower conductive pattern and the second device isolation layer pattern.

20. The non-volatile memory device of claim 1, wherein top surfaces of the second conductive layer and the second device isolation layer pattern are located at substantially the same height.

* * * * *